United States Patent [19]

Kondo et al.

[11] Patent Number: 4,837,122
[45] Date of Patent: Jun. 6, 1989

[54] DELETING FLUID FOR PRINTING PLATES AND METHOD FOR DELETION

[75] Inventors: Toshiro Kondo; Eiji Kanada; Hiroshi Nishinoiri, all of Nagaokakyo, Japan

[73] Assignee: Mitsubishi Paper Mills. Ltd., Tokyo, Japan

[21] Appl. No.: 127,475

[22] Filed: Dec. 2, 1987

[51] Int. Cl.$^4$ ............................ G03C 5/54; G03F 7/06
[52] U.S. Cl. ..................................... 430/204; 430/248; 430/205; 430/302; 430/309; 430/430; 430/431; 430/461; 430/331
[58] Field of Search ............... 430/204, 248, 309, 430, 430/431, 461, 205, 331, 302

[56] References Cited

U.S. PATENT DOCUMENTS

| | | | |
|---|---|---|---|
| 3,770,437 | 11/1973 | Brugger et al. | 430/461 |
| 4,062,682 | 12/1977 | Laridon et al. | 430/204 |
| 4,242,442 | 12/1980 | Idota et al. | 430/430 |
| 4,603,100 | 7/1986 | Boston | 430/204 |
| 4,746,597 | 5/1988 | Zellmer et al. | 430/204 |

*Primary Examiner*—Richard L. Schilling
*Attorney, Agent, or Firm*—Cushman, Darby & Cushman

[57] ABSTRACT

This invention provides a method for deleting images formed on offset printing plates which comprises treating the surface of undesired portion of the images formed by exposure and development with a deletion fluid which contains a ferric complex salt of an organic acid and 0.3 mol/liter or more of at least one compound selected from the group consisting of a soluble bromide and a soluble iodide. Preferred ferric complex salt is a ferric complex salt of aminopolycarboxylic acid.

16 Claims, No Drawings

DELETING FLUID FOR PRINTING PLATES AND METHOD FOR DELETION

BACKGROUND OF THE INVENTION

This invention relates to an image deleting agent for offset printing plates which use silver images produced on the offset printing plates as ink receptive areas which deletes the ink receptivity of the silver images by rendering hydrophilic the undesired portion of the silver images. More particularly, it relates to removal of ink receptivity of undesired portion of silver images photographically or physically formed on offset printing plates by rendering completely hydrophilic that portion of the silver images without giving any adverse effect on printing characteristics and properties of substrate by treating the surface with a specific treating agents at an optional stage of printing procedure. Usually, such treatment is called "deletion" in the field of printing and so the inventors use this terminology in this specification. The treating fluid used for deletion is called "deletion fluid".

Generally, portions of printing plate made by photomechanical process which require deletion include those which are already present in originals to be copied, produced at the time of exposure or produced due to uneven developing treatment, etc.

That is, for example, there are cases where the originals contain undesired images or have dusts, dirty powders, finger prints and other stains and furthermore, when laminated originals are used, a shadow may be produced by the exposure. In order to obtain good printed matters, said portions must be deleted at the stages of plate making and printing. Generally, the deletion is an essential treatment and so it is preferred that necessary deletion can be carried out at an optional stages in plate making and printing procedures.

Many proposals have been made for deleting unnecessary images of offset printing plates which use silver images as ink receptive areas.

For example, the compounds having mercapto or thion group and a hydrophilic group which are disclosed in Japanese Patent Laid-Open Application (Kokai) Nos. 92101/73, 21901/76, 53002/79 and 9661/84 can make hydrophilic the silver images certainly and by almost instantaneous reaction. However, they have disadvantages such as bad odor, adverse effect on human bodies due to strong acidity and poor in storage stability. Thus, further improvement has been demanded.

The deletion fluid containing a ferricyanide or a metal salt of EDTA and a thiocyanate which is disclosed in Japanese Patent Laid-Open Application (Kokai) No. 41808/73 has the problems such as environmental pollution, gradual recovery of ink receptivity by printing after deletion which causes scumming and poor storage stability.

SUMMARY OF THE INVENTION

It is an object of this invention to provide a deletion fluid for offset printing plates which has no adverse effects on human bodies and environment, can rapidly and certainly perform the deletion, can provide hydrophilicity retained for a long period of time after deletion and is excellent in storage stability in the form of solutions.

Further objects and advantages of this invention will be apparent from the disclosures hereinafter.

DESCRIPTION OF THE INVENTION

The above object of this invention has been basically accomplished by a deletion fluid which comprises at least a ferric complex salt of an organic acid and 0.3 mol/l or more of at least one of soluble bromide and soluble iodide.

A preferred example of the ferric complex salt of organic acid is a ferric complex salt of aminopolycarboxylic acid, but ferric salt of phosphonic acid may also be used.

The ferric complex salts of organic acids are ordinarily used in the form of complex salt, but ferric ion complex salt may be formed in solutions using ferric salts such as ferric sulfate, ferric chloride, ferric nitrate, ferric sulfate ammonium, ferric phosphate, etc. and organic acids.

The ferric complex salt of aminopolycarboxylic acid is a complex of ferric ion and an aminopolycarboxylic acid or a salt thereof.

Typical examples of aminopolycarboxylic acids and salts thereof are ethylenediaminetetraacetic acid (EDTS), EDTA disodium salt, EDTA diammonium salt, EDTA tetra(trimethylammonium) salt, EDTA tetrapotassium salt, EDTA tetrasodium salt, EDTA trisodium salt, diethylenetriaminepentaacetic acid, pentasodium diethylenetriaminepentaacetate, ethylenediamine-N-($\beta$-oxyethyl)-N,N',N'-triacetic acid, triammonium ethylenediamine-N-($\beta$-oxyethyl)-N,N',N'-triacetate, propylenediaminetetraacetic acid, disodium propylenediaminetetraacetic acid disodium salt, nitrilotriacetic acid, trisodium nitrilotriacetate, cyclohexanediaminetetraacetic acid, disodium cyclohexanediaminetetraacetate, iminodiacetic acid, dihydroxyethylglycine, ethyletherdiaminetetraacetic acid, ethylenediaminetetrapropionic acid, etc.

Typical examples of phosphonic acids and salts thereof are diethylenetriaminepentamethylenephosphonic acid, cyclohexanediaminetetramethylenephosphonic acid, triethylenetetraminehexamethylenephosphonic acid, glycoletherdiaminetetramethylenephosphonic acid, 1,2-diaminopropanetetramethylenephosphonic acid, methyliminodimethylenephosphonic acid, 1,3-diaminopropane-2-ol tetramethylenephosphonic acid, ethylenediaminetetramethylenephosphonic acid, etc.

Organic acid ferric complex salts comprising optional combinations of these organic acids and said ferric salts can be used.

The organic acid ferric complex salts are used for oxidizing the silver images utilized as ink receptive areas and preferably used in a relatively large amount for oxidizing such silver images to which is firmly adsorbed mercapto compounds and the like which are generally used for enhancing oleophilicity. In general, the ferric complex salts are used in an amount of 0.05–1.0 mol, preferably 0.1–0.5 mol for 1 liter of deletion fluid. They may be used alone or in combination of two or more.

The soluble bromides and soluble iodides are bromides and iodides soluble in solvents of the deletion fluids. Since water is used as a part or the whole of the solvent, as typical examples thereof, mention may be made of water-soluble bromides or iodides such as potassium bromide, sodium bromide, ammonium bromide, potassium iodide, sodium iodide, ammonium iodide, etc.

It is considered that these bromides and iodides react with silver image (silver ion) oxidized with organic acid ferric complex salts to form a hydrophilic silver halide. However, a water-soluble chloride (such as sodium chloride) cannot provide the effect of this invention. Especially preferred are water-soluble bromides.

Amount of the water-soluble bromide or iodide necessary in this invention is at least 0.3 mol per 1 liter of the deletion fluid, preferably 0.5 mol or more and up to the amount in which the compound can be dissolved. These compounds may be used alone or in combination or two or more.

The deletion fluid of this invention can maintain its deleting ability for a longer period of time after use by containing an amino alcohol in addition to said basic two compounds.

The amino alcohol used in this invention is primary, secondary or tertiary amine compound containing at least one hydroxyalkyl group. The amino alcohol includes the compound represented by the general formula (A).

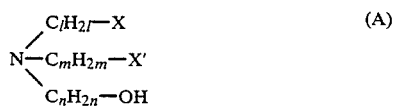

(wherein X and X' each represents a hydrogen atom, a hydroxyl group or an amino group, l and m each indicates 0 or an integer of at least 1 and n indicates an integer of at least 1.)

As typical examples thereof, mention may be made of ethanolamine, diethanolamine, triethanolamine, diisopropanolamine, N-methylethanolamine, N-aminoethylethanolamine, N,N-diethylethanolamine, N,N-dimethylethanolamine, N-methyldiethanolamine, N-ethyldiethanolamine, 3-aminopropanol, 1-amino-propane-2-ol, 4-aminobutanol, 5-amino-pentan-1-ol, 3,3'-iminodipropanol, N-ethyl-2,2'-iminodiethanol, etc.

Further, 2-amino-2-(hydroxymethyl)propane-1,3-diol or 2-amino-2-methylpropane-1,3-diol may also be used.

Amount of the amino alcohol is about 0.3-about 3 mols, preferably about 0.5-about 2 mols per 1 liter of deletion fluid.

The mechanism of action of amino alcohol is not clear, but it can be considered that it prevents the silver image rendered hydrophilic by deletion agent, especially the silver image worn away from becoming gradually ink receptive and keeps stably the hydrophilized silver image.

Deletion fluid containing amino alcohol is especially useful in carrying out deletion by deleting pen such as felt tipped pen. That is, such deletion fluid not only improves the stability with time of edge portion of deleted image, but also acts as a drying controller to prevent over-drying of deleting pen.

It has also been found that when the deletion fluid of this invention is used by means of deleting pen, a deletion fluid which is very slow in drying at pen point and rapid in drying after used and can certainly accomplish the deletion can be obtained by further containing a low molecular weight gelatin in the composition comprising said two basic components or comprising these components and an amino alcohol.

As well known, gelatin is used for photographic materials and foods.

As gelatins, there are known alkali-treated gelatin, acid-treated gelatin and gelatin derivatives subjected to various treatments and modifications and usually they have average molecular weight of several ten thousands to several hundred thousands.

Ordinary average molecular weight of low molecular weight gelatins is about 3,000-30,000, preferably about 5,000-20,000.

The low molecular gelatins are prepared, for example, by enzymatic decomposition of photographic gelatins.

The low molecular weight gelatins may be used in an amount of about 1-about 300 g, preferably about 5-about 200 g per 1 liter of deletion fluid.

The deletion fluid containing the low molecular weight gelatin is especially useful for deletion by pen such as a felt tipped pen or the like. That is, as mentioned above, such deletion fluid not only improves the stability with time of edge portion of deleted images, but also acts as a over-drying inhibitor for inhibiting over-drying of deleting pen.

It has been also found that it is preferred that the deletion fluid of this invention contains a non-fluorinated betaine surface active agent. That is, the non-fluorinated betane surface active agent has the action that deletion can be performed more easily even after oleophilic treatment of silver image (using generally a mercapto compound disclosed in Japanese Patent Examined Publication (Kokoku) No. 29723/73) or after beginning of printing.

The non-fluorinated betaine surface active agent may be generally used in an amount of 0.001-1 g per 1 liter of deletion fluid.

Typical examples of the non-fluorinated betaine surface active agent are as follows:

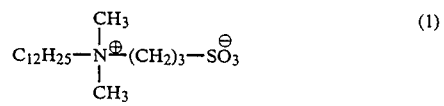

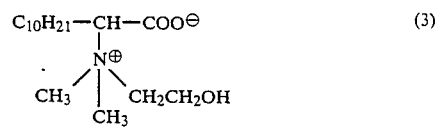

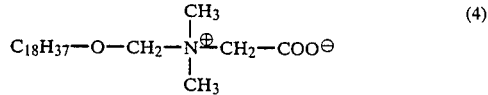

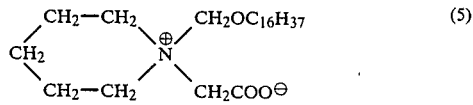

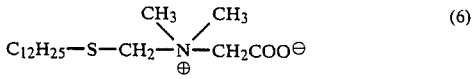

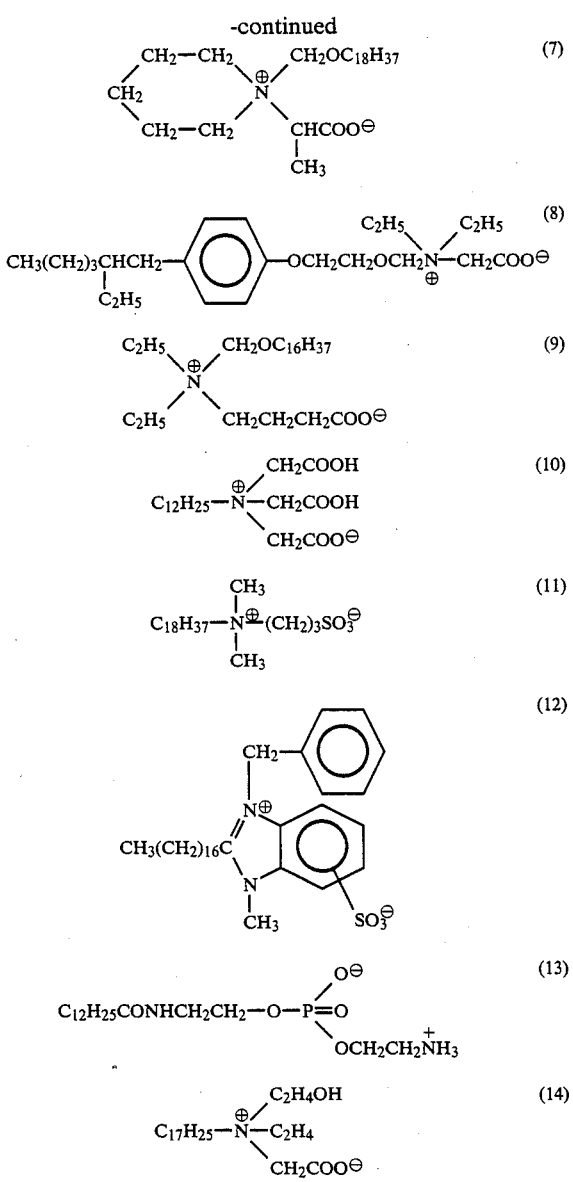

It is not clear why deletion after oleophilic treatment or printing can be satisfactorily accomplished by using the non-fluorinated betane surface active agent, but anion type, cation type and fluorinated betane type surface active agents have no such action or only a little, if any.

It is preferred that deletion fluid can show rapid deletion reaction. However, if deletion is completed by too highly instantaneous reaction, deletion cannot be stopped when deletion fluid is inadvertently applied to the portion not to be deleted. Therefore, there has been desired such deletion fluid which can bring about the instantaneous reaction after lapse of some time, for example, several ten seconds.

It has been found that such deletion fluid can be provided by containing a sulfite in the deletion fluid comprising at least the basic two compounds.

Examples of the sulfite are sodium sulfite, potassium sulfite, sodium bisulfite, etc. It is considered that these sulfites control the oxidizing action of the ferric complex salt of organic acid in such a manner that the object of this invention can be conveniently attained.

Amount of the sulfite is about 0.1-about 1.5 mol, preferably about 0.2-about 1 mol per 1 liter of deletion fluid.

Furthermore, the deletion fluid of this invention can contain said heterocyclic compounds having mercapto group and hydrophilic group (e.g., carboxyl group, sulfonate group).

The deletion fluid of this invention can be used in the form of solution in water, various alcohols or mixed solvent thereof. Furthermore, it can be used for deletion by pen.

pH of deletion fluid is preferably about 6-about 9.

The deletion fluid of this invention can further contain elements for rendering the fluid viscous such as carboxymethyl cellulose, polyvinyl alcohol, glycerine, etc. and elements for coloring the fluid such as dyes, organic or inorganic pigments, etc. It can further contain finely-divided powder as disclosed in Japanese Patent Unexamined Publication (Kokai) No. 21901/76.

The deletion fluid of this invention is stable and can perform deletion rapidly and completely. Besides, even if the deleted portion is strongly rubbed, that portion does not receive ink. Therefore, the printing plate subjected to deletion treatment with the deletion fluid of this invention can be used for printing of a greater number of copies without any problems.

This invention can be applied to offset printing plates which utilize silver images as inkreceptive areas, for example, disclosed in Japanese Patent Examined Publication (Kokoku) No. 30562/73, Japanese Patent Unexamined Publication (Kokai) No. 21602/78 and U.S. Pat. Nos. 3,721,559 and 3,490,905 and furthermore those which utilize silver halide images as ink-receptive areas, for example, disclosed in U.S. Pat. No. 3,454,398 and Japanese Patent Unexamined Publication (Kokai) No. 9603/78.

EXAMPLE 1

A lithographic printing plate was produced in the same manner as in Example 1 of Japanese Patent Unexamined Publication (Kokai) No. 21602/78 except that 1.0 g/m$^2$ of hydroquinone was contained in physical development nuclei layer of offset printing plate (plate No. 3).

The thus obtained lithographic printing plate was exposed imagewise and then was dipped in a transfer developing solution of the following formulation at 30° C. for 30 seconds to perform transfer development. Then, this was dipped in a stopping solution of the following formulation for 30 seconds (25° C.), squeezed to remove excess solution and dried under atmospheric conditions.

Deletion fluids were prepared using the compounds as shown in Table 1 and in the amounts as shown in Table 1. Image portions to be deleted on the above lithographic printing plate were wiped with an absorbent cotton impregnated with said deletion fluid.

[Transfer developing solution]
Water, 700 ml
Potassium hydroxide, 20 g
Anhydrous sodium sulfite, 60 g
Potassium bromide, 0.5 g
2-Mercaptobenzoic acid, 10 mmols
3-Mercapto-4-acetamido-5-n-heptyl-1,2,4-triazol, 0.15 g
2-Methyl-2-amino-1-propanol, 10 g
Water to make up 1 liter.

[Stopping solution]

Water, 2 liters
Citric acid, 10 g
Sodium citrate, 35 g

Thus obtained printing plates were mounted on an offset printing machine A.B. Dick 350 CD (Tradename) and surface thereof was wiped with a solution of the following composition (E) and then printing was carried out. Temperature of the printing room was 22° C. and humidity was 60%.

[E]

Water, 400 ml
Citric acid, 1 g
Sodium citrate, 3.5 g
2-Mercapto-5-heptyl-1,3,5-oxadiazole, 0.5 g
Ethylene glycol, 50 ml Ink receptivity (degree of scumming) of the deleted portions after printing of 20 copies, 2,000 copies and 5,000 copies was evaluated and the results are shown in Table 2.

TABLE 1

| Deletion fluid | A | B | C | D (g) |
|---|---|---|---|---|
| EDTA ferric Ammonium salt | 10 | 10 | 10 | 10 |
| Potassium iodide | — | 15 | — | — |
| Potassium bromide | — | — | 15 | — |
| Potassium chloride | — | — | — | 15 |
| Water to make up 100 ml | | | | |

TABLE 2

| Deletion fluid | Evaluation on deletion | | |
|---|---|---|---|
| | 20 copies | 2,000 copies | 5,000 copies |
| A | x | x | x |
| B | o | o | Δ |
| C | o | o | o |
| D | x | x | x |

Grade for evaluation on deletion
"o" - The deleted portions had no ink-receptivity.
"Δ" - The deleted portions had a slight ink-receptivity.
"x" - The deleted portions were completely ink-receptive.

EXAMPLE 2

Procedure of Example 1 was repeated except that a felt tipped pen in which the deletion fluid of Example 1 was charged was used for deletion. The same results as in Example 1 were obtained.

EXAMPLE 3

Example 2 was repeated using the deletion fluids shown in Table 3.

TABLE 3

| Deletion fluid | E | F | G | H | I |
|---|---|---|---|---|---|
| | (g/100 ml of water) | | | | |
| EDTA 2Na salt | 10 | — | — | — | — |
| EDTA ferric salt | — | 10 | 10 | 10 | 10 |
| Ammonium bromide | — | — | 2 | 8 | 16 |
| Potassium thiocyanate | 10 | 10 | — | — | — |

The results as shown in Table 4.

TABLE 4

| Deletion fluid | Evaluation on deletion | | |
|---|---|---|---|
| | 20 copies | 2,000 copies | 5,000 copies |
| F | x | x | x |
| F | o | Δ | x |
| G | Δ | x | x |
| H | o | o | o |
| I | o | o | o |

EXAMPLE 4

Deletion fluids were prepared using the compounds shown in Table 5 in the amounts as shown in Table 5 and each of them was charged in a felt tipped pen. The portions of the above produced lithographic printing plates to be deleted were deleted by rubbing by said felt tipped pen.

Printing was carried out just after application of the deletion fluid and 8 hours after application of the deletion fluid and the results are shown in Table 6.

TABLE 5

| Deletion fluid | (g/water 100 ml) | | |
|---|---|---|---|
| | J | K | L |
| EDTA ferric ammonium salt | 7 | 7 | 7 |
| Potassium bromide | 13 | 13 | 13 |
| N—methylethanolamine | — | 7 | — |
| N—methyldiethanolamine | — | — | 7 |

TABLE 6

| Deletion fluid | Just after deletion | After 8 hours |
|---|---|---|
| J | o | Δ |
| K | o | o |
| L | o | o |

EXAMPLE 5

Example 4 was repeated except that monoethanolamine, triethanolamine or N,N'-diethylethanolamine was used as amino alcohol. There were obtained similar results to those in Example 4.

Felt tipped pen containing the amino alcohol of Examples 4 and 5 were very slow in drying of its point and it could perform the deletion even after left uncapped for a long time and thus operability was improved.

EXAMPLE 6

A delete fluid was prepared from the following compounds in an amount as shown in the following table and was charged in a felt tipped pen. The portions to be deleted of the lithographic printing plate made hereabove by rubbing with this felt tipped pen.

EDTA ferric ammonium salt, 7
Potassium bromide, 13
Low molecular weight gelatin*, 2
(g/100 ml water)
* Average molecular weight about 18,000

The resulting lithographic printing plate was mounted on an offset printing machine A.B. Dick 350CD (Tradename) and 10,000 copies were printed using etch solution and damping solution exclusively used for Silver Master (Tradename for printing plate of Mitsubishi Paper Mills Ltd.). No scumming occurred even when 10,000 copies were printed.

Further, cap of the felt tipped pen was removed and left under atmospheric conditions of 25° C. (room temperature) and a humidity of 40% RH. Deletion was effected by this felt tipped pen to examine drying property. After left for 3 days, the felt tipped pen could be used for deletion without any problems.

EXAMPLE 7

Deletion fluid prepared by adding 7 ml of N-methylethanolamine to the deletion fluid of Example 6 gave the similar results.

EXAMPLE 8

Deletion fluid prepared by using a gelatin having a molecular weight of about 10,000 as the low molecular weight gelatin in the deletion fluid of Example 6 gave the similar results.

EXAMPLE 9

Printing was carried out using the lighographic printing plate made in Example 1 without deletion treatment. Then, feeding of ink was stopped and ink was removed from the surface of the plate. Then, deletion fluids were prepared using the surface active agents shown in Table 7 and charged in felt tipped pens. Portions to be deleted of said lithographic printing plate were deleted by rubbing with this felt tipped pens.

Printing was restarted and ink-receptivity (scumming) of the deleted portions after printing of 50 copies and 2,500 copies was evaluated by the following criteria and the results are shown in Table 8.

"o": The deleted portion had no ink-receptivity
"Δ": The deleted portion had a slight ink-receptivity
"x": The deleted portions were completely ink-receptive

TABLE 7

| Deletion fluid | (g/water 100 ml) | | | | |
|---|---|---|---|---|---|
| | M | N | O | P | Q |
| EDTA ferric ammonium salt | 10 | 10 | 10 | 10 | 10 |
| Ammonium bromide | 15 | 15 | 15 | 15 | 15 |
| N—methylethanolamine | 8 | 8 | 8 | 8 | 8 |
| Compound (11) (10% solution) | — | 0.1 | — | — | — |
| Compound A (10% solution) | — | — | 0.1 | — | — |
| Compound B (10% solution) | — | — | — | 0.1 | — |
| Compound C (10% solution) | — | — | — | — | 0.1 |

Compound A: Dodecylbenzenesulfonate
Compound B: Di(2-ethyl)hexylsulfosuccinate

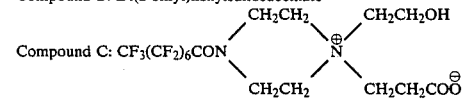

TABLE 8

| Deletion fluid | 50 copies | 2,500 copies |
|---|---|---|
| M | o | Δ |
| N | o | o |
| O | o | Δ |
| P | o | Δ |
| Q | o | Δ |

EXAMPLE 10

After surface of plate was treated with the oleophilizing solution of composition (E) in Example 1, this plate was subjected to deletion treatment by the felt tipped pen of Example 9 and thereafter, printing was carried out. The results were similar to those in Example 9.

EXAMPLE 11

Using felt tipped pen charged with the following deletion fluid, deletion was carried out in accordance with the methods of Examples 9 and 10 and printing was carried out. Good deletion effects were obtained.

(Deletion fluid)
EDTA ferric salt, 90 g
Ammonia bromide, 140 g
Sodium sulfite, 80 g
Diethanolamine, 80 ml
10% solution of compound (3), 1.5 ml
Water to make up 1 liter.

EXAMPLE 12

Deletion fluids were prepared using the compounds in the amounts as shown in Table 9 and portions to be deleted of the lithographic printing plates made hereabove were wiped with an absorbent cotton impregnated with said deletion fluid. Thereafter, the lithographic printing plates were left to stand for the period as shown in Table 10 and then the deletion fluid was absorbed with an absorbent cotton.

TABLE 9

| Deletion fluid | (g/water 100 ml) | |
|---|---|---|
| | R | S |
| EDTA ferric ammonium salt | 10 | 10 |
| Potassium bromide | 15 | 15 |
| Potassium sulfite | — | 10 |

Ink-receptivity of the deleted portions were examined according to the following evaluation criteria and the results are shown in Table 10.

"o": The deleted portions had no ink-receptivity.
"Δ": The deleted portions had a slight ink-receptivity.
"x": The deleted portions were completely ink-receptive.

TABLE 10

| | After 5 sec. | After 15 sec. | After 30 sec. |
|---|---|---|---|
| Deletion fluid R | Δ | o | o |
| Deletion fluid S | x | x | o |

It will be recognized that deletion fluid S cannot eliminate ink-receptivity if it is removed in a short time.

EXAMPLE 13

Example 12 was repeated except that the deletion fluid was charged in a felt tipped pen and deletion was effected. The results obtained were similar to those of Example 12.

Deletion effect was maintained even after printing of 5,000 copies for all deletion fluids.

EXAMPLE 14

Example 13 was repeated using the following deletion fluids T and U. Similarly, effect of sulfite was recognized.

| Deletion fluid | T | U |
|---|---|---|
| EDTA ferric salt | 8 | 8 |
| Ammonium bromide | 12 | 12 |
| Sodium thiosulfate | 3 | 3 |
| Sodium sulfite | — | 7 |
| | | (g/water 100 ml) |

What is claimed is:

1. A method for deleting an undesired portion of a silver image produced by exposure and development on an offset printing plate which uses the silver image as an ink receptive area which comprises treating the surface of the undesired portion of the silver image with a deletion fluid which contains a ferric complex salt of an organic acid and 0.3 mol/liter or more of at least one compound selected from the group consisting of a soluble bromide and a soluble iodide.

2. A method according to claim 1 wherein the ferric complex salt is a ferric complex salt of an aminopolycarboxylic acid.

3. A method according to claim 1 wherein the amount of the ferric complex salt is 0.05–1.0 mol per 1 liter of the deletion fluid.

4. A method according to claim 1 wherein the deletion fluid contains the ferric complex salt and the soluble bromide.

5. A method according to claim 1 wherein the amount of the soluble bromide or iodide is about 0.5 mol/liter or more.

6. A method according to claim 1 wherein the deletion fluid additionally contains an amino alcohol.

7. A method according to claim 6 wherein the amount of the amino alcohol is about 0.3- about 3 mols per 1 liter of the deletion fluid.

8. A method according to claim 1 wherein the deletion fluid additionally contains a low molecular weight gelatin.

9. A method according to claim 8 wherein the amount of the low molecular weight gelatin is about 50 about 200 g per 1 liter of the deletion fluid.

10. A method according to claim 1 wherein the deletion fluid additionally contains a non-fluorinated betaine-type surface active agent.

11. A method according to claim 10 wherein the amount of non-fluorinated betaine-type surface active agent is 0.001–1 g per 1 liter of the deletion fluid.

12. A method according to claim 1 wherein the deletion fluid additionally contains a sulfite.

13. A method according to claim 12 wherein the amount of the sulfite is about 0.1- about 1.5 mol per 1 liter of the deletion fluid.

14. A method according to claim 13 wherein the deletion fluid has a pH of about 6- about 9.

15. A method according to claim 1 wherein the deletion fluid is charged n a felt tipped pen and deletion of the images is carried out by this felt tipped pen.

16. A method according to claim 1 wherein the printing plate to be treated is a printing plate made by forming silver images thereon by silver complex diffusion transfer process.

* * * * *